United States Patent
Analui et al.

(10) Patent No.: US 9,590,794 B2
(45) Date of Patent: Mar. 7, 2017

(54) ENHANCING ISOLATION AND IMPEDANCE MATCHING IN HYBRID-BASED CANCELLATION NETWORKS AND DUPLEXERS

(71) Applicants: Behnam Analui, Irvine, CA (US); Ankush Goel, San Jose, CA (US); Hossein Hashemi, Pacific Palisades, CA (US)

(72) Inventors: Behnam Analui, Irvine, CA (US); Ankush Goel, San Jose, CA (US); Hossein Hashemi, Pacific Palisades, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 268 days.

(21) Appl. No.: 14/565,752

(22) Filed: Dec. 10, 2014

(65) Prior Publication Data

US 2015/0163044 A1    Jun. 11, 2015

Related U.S. Application Data

(60) Provisional application No. 61/940,071, filed on Feb. 14, 2014, provisional application No. 61/914,280, filed on Dec. 10, 2013.

(51) Int. Cl.
*H04L 12/50* (2006.01)
*H04L 5/14* (2006.01)
(Continued)

(52) U.S. Cl.
CPC ............ *H04L 5/1461* (2013.01); *H03F 1/56* (2013.01); *H03F 3/195* (2013.01); *H03F 3/24* (2013.01);
(Continued)

(58) Field of Classification Search
CPC .................. H04L 5/1461; H03F 1/56
(Continued)

(56) References Cited

U.S. PATENT DOCUMENTS

| 2,561,212 A | 7/1951 | Lewis |
| 4,464,675 A | 8/1984 | Balaban et al. |

(Continued)

FOREIGN PATENT DOCUMENTS

| DE | 102012107877 A1 | 2/2014 |
| EP | 1091497 A1 | 4/2001 |

(Continued)

OTHER PUBLICATIONS

Matthaei, G. et al. 1980. Microwave Filters, Impedance-Matching Networks, and Coupling Structures, Chapter 14: Directional, Channel-Separation Filters and Traveling-Wave Ring-Resonators, pp. 843-888; Chapter 16: Multiplexer Design, pp. 965-1000. Copyright 1980 Artech House, Inc., Dedham, MA; reprint of edition published by McGraw-Hill Book Company, Inc., 1964.

(Continued)

*Primary Examiner* — Dang Ton
(74) *Attorney, Agent, or Firm* — McDermott Will & Emery LLP

(57) ABSTRACT

Multi-port hybrid-based cancellation networks may be used to enable simultaneous transmit and receive in one or more co-existent communication systems. A multi-port hybrid-based cancellation network may include a first and second quadrature hybrid, a first and second two-port network, and other circuitry components. The second quadrature hybrid may be distinct from the first quadrature hybrid. The first two-port network may include a first filter or a first amplifier connected between the first and the second quadrature hybrids. The second two-port network may include a second filter or a second amplifier that is distinct from but essen- (Continued)

tially the same as the first filter or the first amplifier connected between the first and the second quadrature hybrids. The other circuitry components may be connected between or connected to a connection between one of the quadrature hybrids and one of the two-port networks. These other circuitry components may have a configuration that minimizes signal return loss at least one of the ports of the multi-port hybrid-based cancellation network. They may in addition or instead have a configuration that maximizes signal isolation between at least two of the ports of the multi-port hybrid-based cancellation network.

23 Claims, 7 Drawing Sheets

(51) Int. Cl.
  *H03F 1/56* (2006.01)
  *H03F 3/195* (2006.01)
  *H03F 3/24* (2006.01)
  *H04B 1/525* (2015.01)

(52) U.S. Cl.
  CPC ....... *H04B 1/525* (2013.01); *H03F 2200/192* (2013.01); *H03F 2200/198* (2013.01); *H03F 2200/204* (2013.01); *H03F 2200/222* (2013.01); *H03F 2200/387* (2013.01)

(58) Field of Classification Search
  USPC .......................................... 370/295, 389, 401
  See application file for complete search history.

(56) References Cited

U.S. PATENT DOCUMENTS

| | | | |
|---|---|---|---|
| 4,694,266 A | 9/1987 | Wright | |
| 4,963,945 A | 10/1990 | Cooper et al. | |
| 4,968,967 A | 11/1990 | Stove | |
| 5,493,246 A | 2/1996 | Anderson | |
| 5,691,978 A | 11/1997 | Kenworthy | |
| 6,194,980 B1 | 2/2001 | Thon | |
| 6,229,992 B1 | 5/2001 | McGeehan et al. | |
| 6,721,544 B1 | 4/2004 | Franca-Neto | |
| 6,819,302 B2 | 11/2004 | Volman | |
| 7,072,614 B1 | 7/2006 | Kasperkovitz | |
| 7,116,966 B2 | 10/2006 | Hattori et al. | |
| 7,123,883 B2 | 10/2006 | Mages | |
| 7,250,830 B2 | 7/2007 | Layne et al. | |
| 7,330,500 B2 | 2/2008 | Kouki | |
| 7,623,005 B2 | 11/2009 | Johansson et al. | |
| 7,633,435 B2 | 12/2009 | Meharry et al. | |
| 7,711,329 B2 | 5/2010 | Aparin et al. | |
| 7,804,383 B2 | 9/2010 | Volatier et al. | |
| 7,894,779 B2 | 2/2011 | Meiyappan et al. | |
| 8,013,690 B2 | 9/2011 | Miyashiro | |
| 8,135,348 B2 | 3/2012 | Aparin | |
| 8,149,742 B1 | 4/2012 | Sorsby | |
| 8,199,681 B2 | 6/2012 | Zinser et al. | |
| 8,385,871 B2 | 2/2013 | Wyville | |
| 8,422,412 B2 | 4/2013 | Hahn | |
| 8,514,035 B2 | 8/2013 | Mikhemar et al. | |
| 8,600,329 B1 | 12/2013 | Comeau et al. | |
| 8,749,321 B2 | 6/2014 | Kim et al. | |
| 2002/0089396 A1 | 7/2002 | Noguchi et al. | |
| 2003/0109077 A1 | 6/2003 | Kim et al. | |
| 2004/0000425 A1 | 1/2004 | White et al. | |
| 2004/0127178 A1 | 7/2004 | Kuffner | |
| 2004/0180633 A1 | 9/2004 | Nakatani et al. | |
| 2005/0070232 A1 | 3/2005 | Mages | |
| 2005/0289632 A1* | 12/2005 | Brooks | H03H 7/461 725/126 |
| 2007/0105509 A1 | 5/2007 | Muhammad et al. | |
| 2008/0128901 A1 | 6/2008 | Zurcher et al. | |
| 2008/0227409 A1 | 9/2008 | Chang et al. | |
| 2008/0261519 A1 | 10/2008 | DeMarco et al. | |
| 2009/0054008 A1 | 2/2009 | Satou | |
| 2009/0121797 A1 | 5/2009 | Karabatsos | |
| 2009/0125253 A1 | 5/2009 | Blair et al. | |
| 2009/0252252 A1 | 10/2009 | Kim et al. | |
| 2009/0289744 A1 | 11/2009 | Miyashiro | |
| 2010/0002620 A1 | 1/2010 | Proctor, Jr. et al. | |
| 2010/0084146 A1* | 4/2010 | Roberts | E21B 43/10 166/386 |
| 2010/0127795 A1 | 5/2010 | Bauer et al. | |
| 2010/0134700 A1 | 6/2010 | Robert et al. | |
| 2010/0148886 A1 | 6/2010 | Inoue et al. | |
| 2010/0177917 A1 | 7/2010 | Van Der Werf | |
| 2010/0323654 A1 | 12/2010 | Judson et al. | |
| 2011/0069644 A1 | 3/2011 | Kim et al. | |
| 2011/0080229 A1 | 4/2011 | Kennington | |
| 2011/0080856 A1 | 4/2011 | Kenington | |
| 2011/0134810 A1 | 6/2011 | Yamamoto et al. | |
| 2011/0140803 A1 | 6/2011 | Kim et al. | |
| 2011/0227664 A1 | 9/2011 | Wyville | |
| 2012/0007605 A1 | 1/2012 | Benedikt | |
| 2012/0063496 A1 | 3/2012 | Giannini et al. | |
| 2012/0140860 A1 | 6/2012 | Rimini et al. | |
| 2012/0154071 A1 | 6/2012 | Bradley et al. | |
| 2012/0163245 A1 | 6/2012 | Tone et al. | |
| 2012/0194269 A1 | 8/2012 | Schlager et al. | |
| 2012/0201153 A1 | 8/2012 | Bharadia et al. | |
| 2012/0201173 A1 | 8/2012 | Jain et al. | |
| 2012/0212304 A1 | 8/2012 | Zhang et al. | |
| 2012/0230227 A1 | 9/2012 | Weiss | |
| 2013/0016634 A1 | 1/2013 | Smiley | |
| 2013/0063299 A1 | 3/2013 | Proudkii | |
| 2013/0083703 A1 | 4/2013 | Granger-Jones et al. | |
| 2013/0109330 A1 | 5/2013 | Sahota et al. | |
| 2013/0113576 A1 | 5/2013 | Inoue et al. | |
| 2013/0130619 A1 | 5/2013 | Harverson et al. | |
| 2013/0154887 A1 | 6/2013 | Hein et al. | |
| 2013/0201880 A1 | 8/2013 | Bauder et al. | |
| 2013/0201881 A1 | 8/2013 | Bauder et al. | |
| 2013/0201882 A1 | 8/2013 | Bauder et al. | |
| 2013/0241655 A1 | 9/2013 | Liss et al. | |
| 2013/0241669 A1 | 9/2013 | Mikhemar et al. | |
| 2013/0242809 A1 | 9/2013 | Tone et al. | |
| 2013/0321097 A1 | 12/2013 | Khlat et al. | |
| 2014/0169236 A1 | 6/2014 | Choi et al. | |
| 2014/0194073 A1 | 7/2014 | Wyville et al. | |
| 2014/0204808 A1 | 7/2014 | Choi et al. | |
| 2014/0376419 A1 | 12/2014 | Goel et al. | |
| 2015/0118978 A1 | 4/2015 | Khlat | |

FOREIGN PATENT DOCUMENTS

| | | |
|---|---|---|
| EP | 2733855 A1 | 5/2014 |
| EP | 2960981 A1 | 12/2015 |
| WO | WO 95/15018 A1 | 6/1995 |
| WO | WO2014032883 A1 | 3/2014 |
| WO | WO2014133625 A2 | 9/2014 |
| WO | WO2015089092 A1 | 6/2015 |

OTHER PUBLICATIONS

US International Searching Authority. 2015. International Search Report and Written Opinion of the International Searching Authority for PCT Application PCT/US069372, filed Dec. 9, 2014, entitled "Enhancing Isolation and Impedance Matching in Hybrid-Based Cancellation Networks and Duplexers" (corresponds to the instant application), Search Report issued Mar. 3, 2015.

USPTO. 2016. Non-final Office Action, dated May 20, 2016, for U.S. Appl. No. 14/622,627, entitled "Reflection and Hybrid Reflection Filters."

USPTO. 2016. Final Office Action, dated Mar. 31, 2016, for U.S. Appl. No. 14/626,572, entitled "Miniature Acoustic Resonator Based Filters and Duplexers with Cancellation Methodology," filed Feb. 19, 2015.

(56) References Cited

OTHER PUBLICATIONS

USPTO. 2015. Office Action, dated Jul. 29, 2015 for U.S. Appl. No. 14/626,572, entitled "Miniature Acoustic Resonator Based Filters and Duplexers with Cancellation Methodology," filed Feb. 19, 2015.
European Patent Office (EPO). 2016. Extended European Search Report, dated Jul. 4, 2016, for European Application No. 13876497.2, entitled "Passive Leakage Cancellation Networks for Duplexers and Coexisting Wireless Communication Systems."
Hunter, I.C. et al. 2005. Passive Microwave Receive Filter Networks Using Low-Q Resonators. IEEE Microwave Magazine, Sep. 2005, pp. 46-53.
Kannangara, S. et al. 2007. Analysis of an Adaptive Wideband Duplexer With Double-Loop Cancellation. IEEE Transactions on Vehicular Technology, vol. 56, No. 4, pp. 1761-1982, Jul. 2007.
Phudpong, P. et al. 2007. Nonlinear Matched Reflection Mode Bandstop Filters for Frequency Selective Limiting Applications. In Microwave Symposium Conference, 2007, IEEE/MTT-S International, 2007, pp. 1043-1046.
Korean International Searching Authority (ISA/KR). 2014. International Search Report and Written Opinion of the International Searching Authority, mailed Sep. 23, 2014, for PCT Application PCT/US2013/074155, entitled "Passive Leakage Cancellation Networks for Duplexers and Coexisting Wireless Communication Systems," published as WO 2014/133625A1.
United States International Searching Authority (ISA/US). 2015. International Search Report and Written Opinion of the International Searching Authority, mailed May 20, 2015, for PCT Application PCT/US2015/016145, entitled "Hybrid-Based Cancellation in Presence of Antenna Mismatch," filed Feb. 17, 2015.
United States International Searching Authority (ISA/US). 2015. International Search Report and Written Opinion of the International Searching Authority, mailed May 27, 2015, for PCT Application PCT/US2015/015930, entitled "Reflection and Hybrid Reflection Filters," filed Feb. 13, 2015.
United States Patent and Trademark Office. 2015. Non-final Office Action, dated Jun. 15, 2015, for U.S. Appl. No. 14/102,244, filed Dec. 10, 2013, entitled "Passive Leakage Cancellation Networks for Duplexers and Coexisting Wireless Communication Systems," published Dec. 25, 2015 as US2014/0376419.
United States International Searching Authority (ISA/US). 2015. International Search Report and Written Opinion of the International Searching Authority, mailed Jun. 25, 2015, for PCT Application PCT/US2015/016642, entitled "Miniature Acoustic Resonator-Based Filters and Duplexers with Cancellation Methodology," filed Feb. 19, 2015.
USPTO. 2016. Non-final Office Action, dated Jul. 15, 2016, for U.S. Appl. No. 14/626,572, entitled "Miniature Acoustic Resonator-Based Filters and Duplexers with Cancellation Methodology."
USPTO. 2016. Notice of Allowance, dated Jul. 20, 2016, for U.S. Appl. No. 14/102,244, entitled "Passive Leakage Cancellation Networks for Duplexers and Coexisting Wireless Communication Systems."
Laforge, P.D. et al 2009. Diplexer design implementing highly miniaturized multilayer superconducting hybrids and filters. IEEE Transactions on Applied Superconductivity, Apr. 2009, pp. 47-54.
Marcatili, E.A. et al. 1961. Band-Splitting Filter. Bell System Technical Journal, Jan. 1961, pp. 197-212.
USPTO. 2015. Final Office Action for U.S. Appl. No. 14/102,244, dated Sep. 22, 2015, entitled "Passive Leakage Cancellation Networks for Duplexers and Coexisting Wireless Communication Systems," Goel et al., inventors, published Dec. 25, 2014 as US 2014/0376419 A1.

\* cited by examiner

ENHANCING ISOLATION AND IMPEDANCE MATCHING IN HYBRID-BASED CANCELLATION NETWORKS AND DUPLEXERS

CROSS-REFERENCE TO RELATED APPLICATIONS

This application is based upon and claims priority to U.S. provisional patent application 61/940,071, entitled "Methodology to Improve Isolation in Hybrid-Based Duplexers," filed Feb. 14, 2014, and to U.S. provisional patent application 61/914,280, entitled "Wideband Passive Cancellation and Duplexer," filed Dec. 10, 2013. The entire content of each of these applications is incorporated herein by reference.

BACKGROUND

Technical Field

This disclosure relates to communication systems supporting simultaneous transmit and receive, co-existent communication devices, systems requiring enhanced isolation between certain ports or blocks, and other systems where signal cancellations are achieved through quadrature hybrids.

Description of Related Art

In a Frequency Division Duplex (FDD) radio communication system, the transmitter (TX) and the receiver (RX) of the same radio may operate simultaneously, but, in two different frequency bands, $f_{tx}$ for TX and $f_{rx}$ for RX. In such scenarios, an important performance metric for the radio communication system may be the degree of "isolation" between the TX and the RX that are operating simultaneously. The isolation can be particularly important within the TX frequency band and within the RX frequency band. Any leakage that reaches the RX within the TX frequency band or the RX frequency band may interfere significantly with the receiver.

On the other hand, many platforms include several communication devices at close proximity. Examples may include commercial or military platforms, such as handheld or portable platforms, that include various voice and data communication transceivers as well as wireless positioning solutions. In these platforms, various communication devices may operate at the same time, resulting in unwanted interference among them. In such co-existence scenarios, high isolation between various simultaneously-operating communication devices may be needed to ensure proper operation.

The minimum required isolation may depend on the application and the scenario. For example, in a typical commercial FDD radio, TX to RX isolation of 50 dB or more may be required in the TX and the RX frequency bands. Without adequate isolation, the aggressor TX signal may significantly deteriorate the sensitivity of the victim RX and ultimately prevent its proper operation. In a co-existence radio, the isolation between the platforms may need to be even higher.

One approach to providing TX-RX isolation is to use a frequency duplexer. The frequency duplexer is a three port electrical network. One port is typically connected to the antenna (ANT), one port is typically connected to the TX output, and one port is typically connected to the RX input.

A common challenge in duplexer design is to achieve low insertion loss from TX to ANT and from ANT to RX, while providing high isolation from TX to RX. However, meeting this requirement may require costly resonator technologies, such as Bulk Acoustic Wave (BAW) resonators.

Another approach to enhancing isolation between TX and RX is to generate a cancellation signal that fully or partially matches the amplitude of the leakage signal from the aggressor TX to the victim RX, but with the opposite phase (negative sign). The cancellation signal is then combined with the leakage signal to cancel it out and enhance isolation.

One example of a cancellation network utilizes quadrature hybrids and other components to ensure an acceptable amount of isolation among various ports.

A variety of non-idealities, such as component mismatches, path imbalances, finite component isolations, impedance mismatches, and varying antenna mismatch, however, can diminish the effectiveness of the cancellation and thus the degree of isolation that is achieved, as well as the amount of signal return losses at an impedance mismatched port.

SUMMARY

A multi-port hybrid-based cancellation network may include a first and second quadrature hybrid, and a first and second two-port network. The second quadrature hybrid may be distinct from the first quadrature hybrid. The first two-port network may include a first filter or a first amplifier connected between the first and the second quadrature hybrids. The second two-port network may include a second filter or a second amplifier that is distinct from but essentially the same as the first filter or the first amplifier connected between the first and the second quadrature hybrids. Other circuitry components may be connected between or connected to a connection between one of the quadrature hybrids and one of the two-port networks. These other circuitry components may have a configuration that reduces or minimizes signal return loss in at least one of the ports of the multi-port hybrid-based cancellation network. They may in addition or instead have a configuration that increases or maximizes signal isolation between at least two of the ports of the multi-port hybrid-based cancellation network.

The first and the second two-port networks may each include a filter which may each be tunable or switchable, multiple filters connected in parallel or series, and/or an amplifier.

The one or more other circuitry components may include one or more attenuators, phase shifters, delay elements, and/or impedance matching networks, each with fixed or tunable characteristics.

At least one of the quadrature hybrids, the two-port networks, or the other circuitry components may include an adjustable component that can be adjusted to minimize the signal return loss or maximize the signal isolation. The multi-port hybrid-based cancellation network may include calibration logic that detects signals at one or more of the ports and develops information or one or more signals based on the detected signal(s) that is relevant to adjusting the adjustable component to minimize the signal return loss or maximize the signal isolation.

The multi-port hybrid-based cancellation network may have a configuration that operates effectively within multiple frequency bands.

One of the multi-ports may function as a transmit port, another of the multi-ports may function as a receive port, and another of the multi-ports may function as an antenna port. The first two-port network may include a first filter connected between the first and the second quadrature hybrids. The second two-port network may include a second filter that is distinct from but essentially the same as the first filter connected between the first and the second quadrature hybrids. The one or more other circuitry components may minimize signal return loss in at least one of the ports of the hybrid-based duplexer and/or maximize signal isolation between the transmit port and the receive port of the multi-port hybrid-based cancellation network. The multi-port hybrid-based cancellation network may further include a third filter that is distinct from the first and the second filters connected to the first quadrature hybrid. The third filter may be tunable or switchable.

The ports of the multi-path network may not correspond to the same communication system. For instance, one or more ports may correspond to transmitting ports of one or more communication system, while one or more other ports may correspond to receiving ports of one or more other communication systems in a coexistence scenario.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent to a person of ordinary skill in the art may have been omitted. Some embodiments may be practiced with additional components or steps and/or without all of the components or steps that are described.

Figure 1:
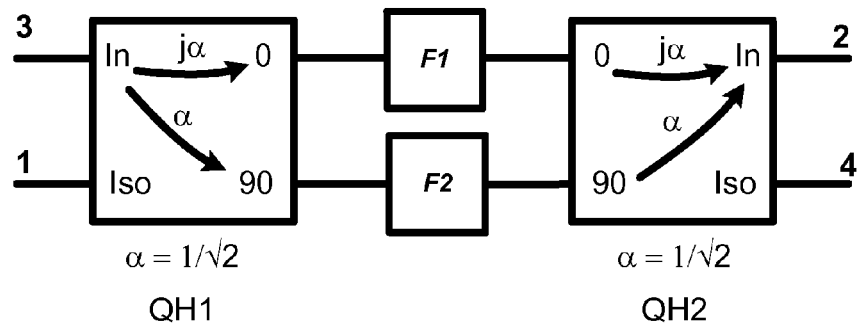
FIG. 1 illustrates an embodiment of a prior art hybrid-based cancellation network.

FIG. 1 illustrates an embodiment of a prior art hybrid-based cancellation network. Hybrid-based cancellation can provide a simple way to create cancelling signals. Two quadrature hybrids QH1 and QH2 may be used with two essentially identical filters F1 and F2 inserted between them. Each quadrature hybrid may have four ports: an input port, a through port, a coupled port, and an isolated port. The signal entering the input port may split equally between the through port and the coupled port and no signal may come out of the isolated port. The signals coming out of the through port and the coupled port may have quadrature phase shift with respect to each other. Any of the four ports of the quadrature hybrid may be used as an input port with other ports appropriately reassigned.

Each filter can have a low-pass, high-pass, band-pass, band-stop, multi-band or any other transfer function. The signal from port 3 gets split in two halves because of the first hybrid QH1, but with a 90° phase shift. Each half goes through a filter and the two halves combine again because of second hybrid QH2 at port 2, but with an additional phase shift of 90°. Since the total phase shift in one half compared to the other half is 180°, the two halves get cancelled after recombination. On the other hand, the two halves of the signal from port 3 see the same phase shift when they reach port 4 and hence combine constructively. Similarly, the two halves of the signal from port 1 see the same phase shift when they reach port 2 and hence also combine constructively. A portion of the two halves of the signal from port 3 after the first hybrid QH1, which are already 90° out-of-phase, get reflected at the inputs of the two filters F1 and F2, go through the first hybrid QH1 again experiencing another 90° phase shift relative to each other, and finally combine constructively at port 1.

For a bandpass filter, if the frequency of the signal at the input of the filter is within the passband of the filter, the signal may go through the filter to the output of the filter.

Whereas, if the frequency of the signal at the input of the filter is outside the passband of the filter, the signal may get reflected at the input of the filter. For bandstop filter, the situation will be reversed.

If bandpass filters are used as filtering elements in the hybrid cancellation scheme of FIG. 1, the signal from port 3 with frequency lying in the passband of the filters F1 and F2 will transmit to port 4, while the signal from port 3 with frequency lying outside the passband of the filters 101 and 103 will transmit to port 1, and ideally nothing is transmitted to port 2. Similarly, the signal from port 1 with frequency lying in the passband of the filters F1 and F2 will transmit to port 2, while the signal from port 1 with frequency lying outside the passband of the filters 101 and 103 will transmit to port 3, and ideally nothing is transmitted to port 4. This is an underlying concept of directional or band-splitting filtering.

Figure 2:
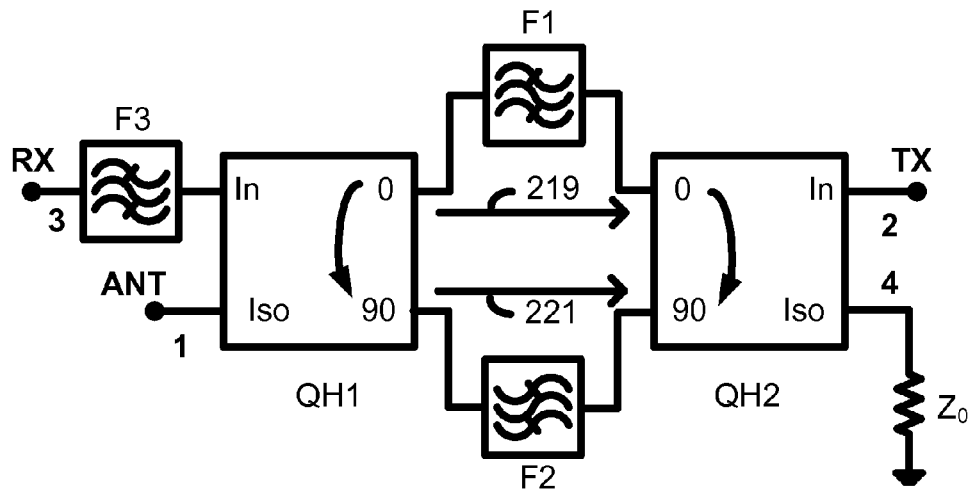
FIG. 2 illustrates an embodiment of a prior art duplexer based on a hybrid cancellation scheme.

A conventional hybrid cancellation based duplexer can use these principles to achieve frequency duplexing. FIG. 2 illustrates an embodiment of a prior art duplexer based on a hybrid cancellation scheme. Port 3 is the RX port, port 2 is the TX port, port 1 is the antenna port, and port 4 is terminated with a matched load $Z_o$. The two essentially identical filters F1 and F2 are between the two quadrature hybrids QH1 and QH2 and an RX filter F3 is added at port 3 to provide additional filtering. The roles of the TX and RX ports may be reversed, while simultaneously modifying the frequency response of the filters, in an alternate duplexer scheme following a similar fundamental cancellation principle.

The cancellation property of the two quadrature hybrids QH1 and QH2 allows for ideally infinite isolation between the TX port 2 and the RX port 3, an essential performance metric of the duplexer. However, in presence of non-idealities, the isolation can be far from perfect. The non-idealities may be, for example, component mismatches, path imbalances, impedance mismatches, finite hybrid isolation, and/or antenna mismatch. Any number of non-idealities may result in imperfect cancellation and hence inadequate isolation between the desired ports.

As an example, let $\Delta a$ and $\Delta \theta$ be the gain and phase mismatch, respectively, between signal paths 219 and 221. The TX to RX isolation approximately may be given as:

$$S_{TX,RX} \approx (\Delta a + j\Delta\Theta) S_{TX,21} S_{RX,21}, \quad (1)$$

where $S_{TX,21}$ and $S_{RX,21}$ are the transfer functions between the input and the output of the TX filter F1 and the RX filter F2, respectively. Assume a 5% gain and phase mismatch, which maybe common in practical implementations, 20 dB attenuation of RX filter F2 in the TX band and 20 dB attenuation of TX filter F1 in the RX band. The maximum achievable isolation in presence of mismatches may only be about 36 dB. For many typical applications, the requirement for TX to RX isolation is 50 dB or higher. With finite isolation/of the hybrids QH1 and QH2 between their through and coupled ports, the TX to RX isolation of the duplexer approximately may be given as:

$$S_{TX,RX} \approx 2jIS_{TX,21} S_{RX,21} S_{TX,11}, \quad (2)$$

where $S_{TX,11}$ is the input reflection coefficient of the TX filter F1. An isolation of 20 dB may typically be obtained between through and coupled ports of the hybrid which results in duplexer isolation of only about 34 dB.

Other embodiments of the duplexer based on a hybrid cancellation scheme, such as the one where the TX ports and filters are interchanged with the RX port and filter in FIG. 2, may these as well as other non-idealities.

Figure 3:
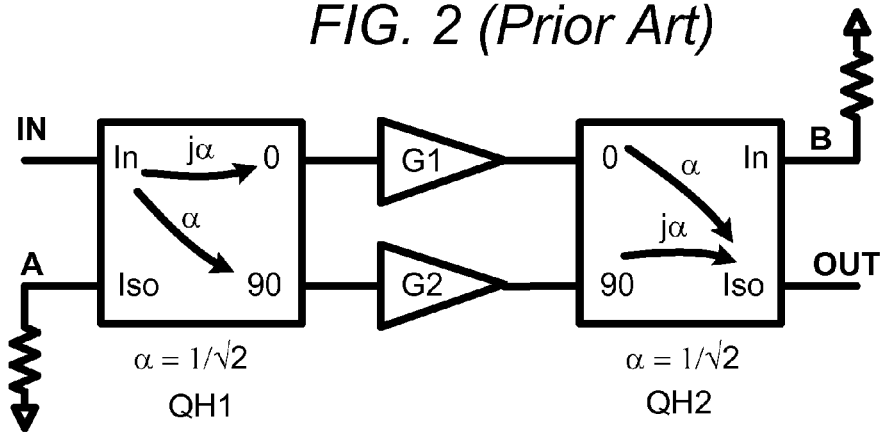
FIG. 3 illustrates an embodiment of a prior art balanced amplifier using a hybrid-based cancellation approach.

The hybrid based cancellation principle and network has been used in other applications, such as balanced amplifiers. FIG. 3 illustrates an embodiment of a prior art balanced amplifier using a hybrid-based cancellation approach with the two quadrature hybrids QH1 and QH2. One of the advantages of this scheme is that it may provide good impedance matching at input port IN and output port OUT of the balanced amplifier, irrespective of the quality of the input and output match of composite amplifiers G1 and G2. Any reflections from the input of the composite amplifiers G1 and G2 may be cancelled at the input port IN and may be absorbed by a matched load at port A. Similarly, any reflections from the output of the composite amplifiers G1 and G2 may be cancelled at the output port OUT and may be absorbed by the matched load at the port A. However, similar to the duplexer case, non-idealities such as mismatches in the two branches and finite hybrid isolation may limit the matching obtained at the input and output ports due to imperfect cancellation.

Figure 4:
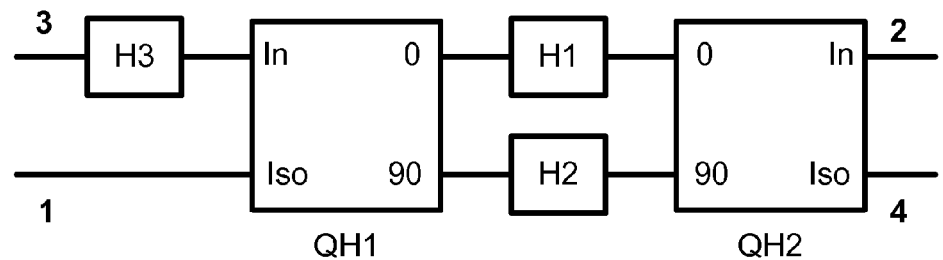
FIG. 4 illustrates an embodiment of a prior art generic hybrid-based cancellation system.

FIG. 4 illustrates an embodiment of a prior art generic hybrid-based cancellation system. The cancellation system may be a 4 port network with ports 1, 2, 3, and 4. It may include the two quadrature hybrids QH1 and QH2, active or passive circuits H1 and H2 having transfer functions H1 and H2, respectively, which may be substantially the same, and an additional active or passive circuit H3 having a transfer function of H3. The hybrids QH1 and QH2 may each have an input port "In", an isolated port "Iso," and zero and quadrature outputs "0" and "90" respectively. With appropriate H1 and H2 transfer functions and an appropriate connection to port 4, any signal loss from port 3 to port 2 may be high. The signals from port 3 may travel to port 2 from two different paths. They may arrive at port 2 with same amplitude, but a 180 degree phase shift with respect to each other, and, as a result, may cancel out at port 2. Therefore, this architecture may act as a cancellation architecture. Signal loss from port 3 to port 1 and from port 1 to port 2 may be low. H1 and H2 may be frequency selective transfer functions, e.g. band pass filters, at appropriate frequencies. For example, in cancellation architecture for duplexer applications, H1 can be the band pass filter Fl for the RX band and H2 can be the band pass filter F2 for the TX band, as shown in FIG. 2. Port 2 may be the RX port of the duplexer; port 3 may be the TX port of the duplexer; port 1 may be the ANT port of the duplexer, and port 4 may be terminated to proper load impedance. In general, H1 and H2 may be passive or active, reciprocal or non-reciprocal, or any generic type of two-port networks.

Assuming mismatch is quantified by amplitude and phase mismatch, $\Delta a$ and $\Delta \theta$, respectively, and a limited isolation/in the hybrid, the overall the TX to RX isolation approximately may be given as:

$$S_{TX,RX} \approx (\Delta a + j\Delta\theta) S_{TX,21} S_{RX,21} + 2jIS_{TX,21} S_{RX,21} S_{TX,11}. \quad (3)$$

It can be seen from the equation (3) that if an intentional amplitude and phase mismatch is introduced, it may be possible to cancel the term resulting due to the finite coupling I. The method is generic and can be applied to other forms of non-idealities, such as coupling between H1 and H2, mismatches in the two paths, etc. Furthermore, it can be applied to various forms and embodiments of FIG. 4, including but not limited to tunable duplexers, multi-band duplexers (e.g. for carrier aggregation), coexistent communication systems, and balanced amplifiers.

Described next are potential solutions to the limitations in hybrid-based networks and duplexers imposed by non-idealities, such as mismatches in the main and cancellation paths, as well as limited isolation in the hybrids.

Figure 5:
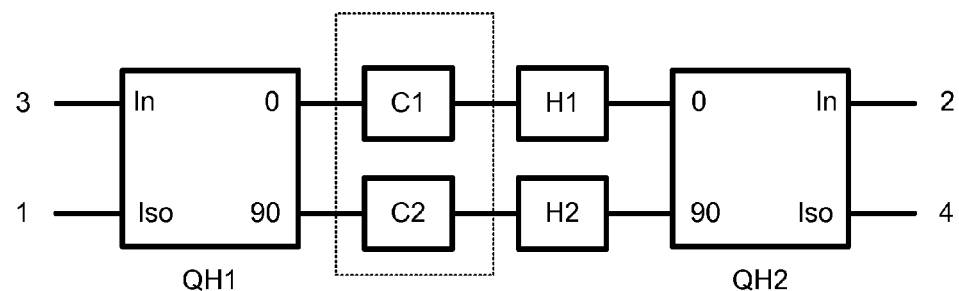
FIG. 5 illustrates an embodiment of an enhanced hybrid-based cancellation scheme with correction blocks C1 and C2 added to improve isolation or impedance matching.

FIG. 5 illustrates an embodiment of an enhanced hybrid-based cancellation scheme with correction blocks C1 and C2 added at 0° and 90° ports of two quadrature hybrids QH1 and QH2. The blocks H1 and H2 may be essentially the same and may be fixed or tunable passive or active two-port networks. The positions of these block are not limited to only these ports, but can be placed anywhere in the top and the bottom branch. The sequence of H1, C1 and H2, C2 may be immaterial. Correction blocks C1 and C2 may be broken into multiple circuitries that may be placed before or after H1 and H2.

Figure 6:
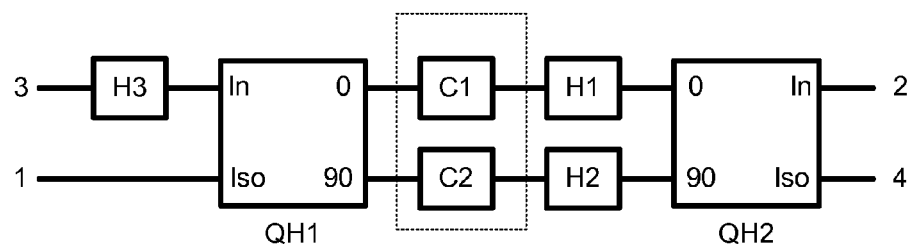
FIG. 6 illustrates another embodiment of an enhanced hybrid-based cancellation scheme with correction blocks C1 and C2 added to improve isolation.

FIG. 6 illustrates an embodiment of an enhanced hybrid-based cancellation scheme with correction blocks C1 and C2 added at 0° and 90° ports of two quadrature hybrids QH1 and QH2. The blocks H1 and H2 may be essentially the same, and the blocks H1, H2, and H3 may be fixed or tunable, passive or active two-port networks. The positions of these block are not limited to only these ports, but can be placed anywhere in the top and the bottom branch. The sequence of H1, C1 and H2, C2 may be immaterial. Correction blocks C1 and C2 may be broken into multiple circuitries that may be placed before or after H1 and H2.

Figure 7:
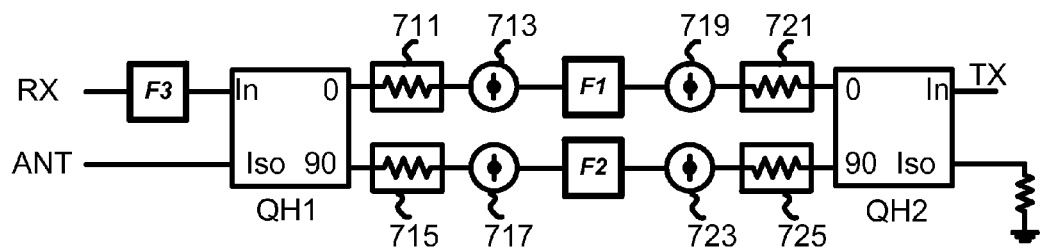
FIG. 7 illustrates an embodiment of an enhanced hybrid-based cancellation scheme with correction blocks that include phase shifters and attenuators, and three ports associated with an antenna, a receiver, and a transmitter.

FIG. 7 illustrates an embodiment of an enhanced hybrid-based cancellation scheme, adopted for duplex transmission and reception. Fixed attenuators 711, 715, 721, and 725 and phase shifters 713, 717, 719, and 723 are added at the 0° and 90° ports of the two quadrature hybrids QH1 and QH2. The filters F1, F2, and/or F3 may be fixed band-pass, band-stop, or multi-band TX and RX filters, respectively. The positions of these block are not limited to only these ports, but can be placed anywhere in the top and the bottom branch. The sequence of phase shifters, attenuators, F1 and phase shifters, attenuators, F2 may be immaterial. The phase shifters and attenuators may be broken into multiple circuitries that may be placed before or after or before and after F1 and F2.

Figure 8:
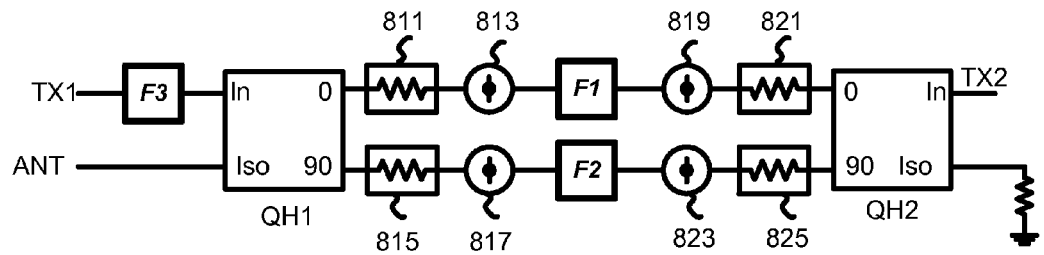
FIG. 8 illustrates an embodiment of an enhanced hybrid-based cancellation scheme with correction blocks that include phase shifters and attenuators, and three ports associated with an antenna and two different transmitters.

FIG. 8 illustrates an embodiment of an enhanced hybrid-based cancellation scheme adopted for a coexistence scenario when two transmitters are present. Fixed attenuators 811, 815, 821, and 825 and phase shifters 813, 817, 819, and 823 may be added at the 0° and 90° ports of the two quadrature hybrids QH1 and QH2. The filters F1, F2, and/or F3 may be fixed band-pass, band-stop, or multi-band TX1 and TX2 filters, respectively. The positions of these block are not limited to only these ports, but can be placed anywhere in the top and the bottom branch. The sequence of phase shifters, attenuators, F1 and phase shifters, attenuators, F2 may be immaterial. The phase shifters and attenuators may be broken into multiple circuitries that may be placed before or after or before and after F1 and F2.

Figure 9:
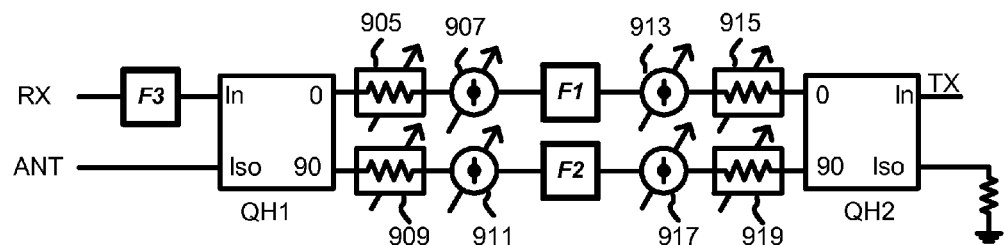
FIG. 9 illustrates an embodiment of an enhanced hybrid-based cancellation scheme with correction blocks that include variable phase shifters and variable attenuators, and three ports associated with an antenna, a receiver, and a transmitter.

FIG. 9 illustrates another embodiment of an enhanced hybrid-based cancellation scheme adopted for duplex transmission and reception, using variable attenuators and/or phase shifters. In this case, however, one or more of attenuators 905, 909, 915, and 919 and phase shifters 907, 911, 913, and 917 may be tunable or selectable and placed at the 0° and 90° ports of the two quadrature hybrids QH1 and QH2, giving additional flexibility to address dynamic or unknown non-idealities. The filters F1, F2, and F3 may also be used, which may be band pass filters or filters of another type.

Figure 10:
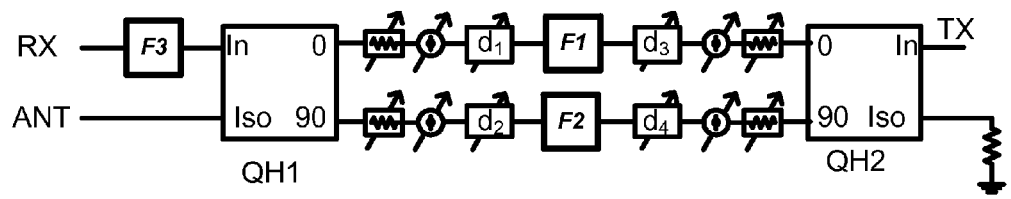
FIG. 10 illustrates an embodiment of an enhanced hybrid-based cancellation scheme with correction blocks that include variable phase shifters, variable attenuators, blocks that provide variable delay, and three ports associated with an antenna, a receiver, and a transmitter.

To improve cancellation bandwidth, delay elements may also be used along with the phase shifters and/or the attenuators. FIG. 10 shows another embodiment of an enhanced hybrid-based cancellation scheme adopted for duplex transmission and reception, and using variable attenuators, phase shifters, and/or delay elements. Delays $d_1$-$d_4$ may be chosen in order to compensate for the effect of delay mismatch in the main and the cancellation path. The delays may also be chosen to match the delay of the isolation path between the 0° and 90° ports of the two quadrature hybrids QH1 and QH2. Furthermore, the delays may be made tunable to give additional flexibility, along with the attenuators and/or phase shifters. The sequence of phase shifters, attenuators, delay elements, F1 and phase shifters, attenuators, delay elements, F2 may be immaterial. The phase shifters, attenuators and delay elements may be broken into multiple circuitries that may be placed before or after or before and after F1 and F2.

Figure 11:
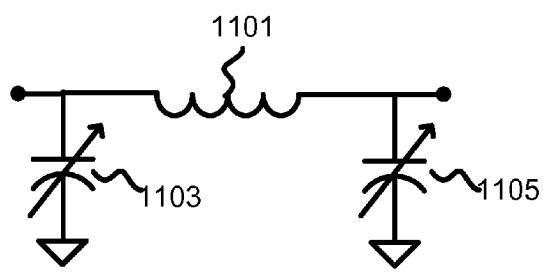
FIG. 11 illustrates an embodiment of circuitry that includes an inductor and two tunable capacitors that create variable delay that may be used in correction circuitries.

FIG. 11 illustrates an embodiment of a tunable delay element using a τ-network of an inductor 1101 and tunable capacitors 1103 and 1105.

Other types of delay blocks may be used, such as those utilizing transmission lines or lumped circuit components. The delay blocks may be broadband or narrowband providing suitable delay or group delay at frequencies of interest.

Various existing or new device and component technologies and their combinations can be used to implement the blocks, such as the attenuators, phase shifters, filters, and delay elements, in the proposed architectures. Impedance matching networks may be used in addition or instead. Examples include: acoustic resonator-based technologies, electromagnetic resonator-based technologies, integrated passive device technologies, surface mount component passive technologies, integrated switch technologies, tunable MEMS capacitor technologies, tunable BST capacitor technologies, tunable SOI capacitor, tunable SOS capacitor, or tunable CMOS capacitor technologies, and circulator or isolator based technologies. They can be integrated along with blocks H1, H2, QH1 and QH2 on a single chip. They can also be implemented using active elements.

While not all technologies are possible for all claimed architectures, many combinations are. Specifically, for architectures where H1, H2, F1, and F2 use filter transfer functions, various embodiments are possible in which the filter transfer functions can be implemented by various methods of combining fixed and tunable or switched elements, including using lumped passive components that may be discrete, or integrated in a silicon chip, or embedded in a Printed Circuit Board (PCB) substrate or package. They can also be implemented using lower-Q electrical resonators realized on a PCB, single or multiple integrated circuits, or package, or using other electromagnetic type resonators, such as ceramic or other dielectric resonators. In addition, the resonators can be based on mechanical or acoustic resonators, including MEMs, SAW, BAW types. They can also be active filters such as $g_m$-C filters or switched capacitor filters.

The tunable components can be MEMS tunable capacitors as well as digitally tunable capacitors in silicon, Silicon On Insulator (SOI), Silicon On Sapphire (SOS), or capacitors from tunable PIN diodes or tunable dielectric materials, such as various forms of BST. In addition, for architectures where H1, H2, F1, F2 use filter transfer functions, the filter transfer functions may be implemented by various filter topologies and synthesis methods, including, but not limited to, ladder, coupled resonator-based, combline, Chebyshev, Butterworth, Bessel, and elliptic. In addition, the hybrids may be implemented by various passive topologies and technologies, including branch-line, Lange, distributed, lumped element, and lump element using integrated passive technology.

Figure 12:
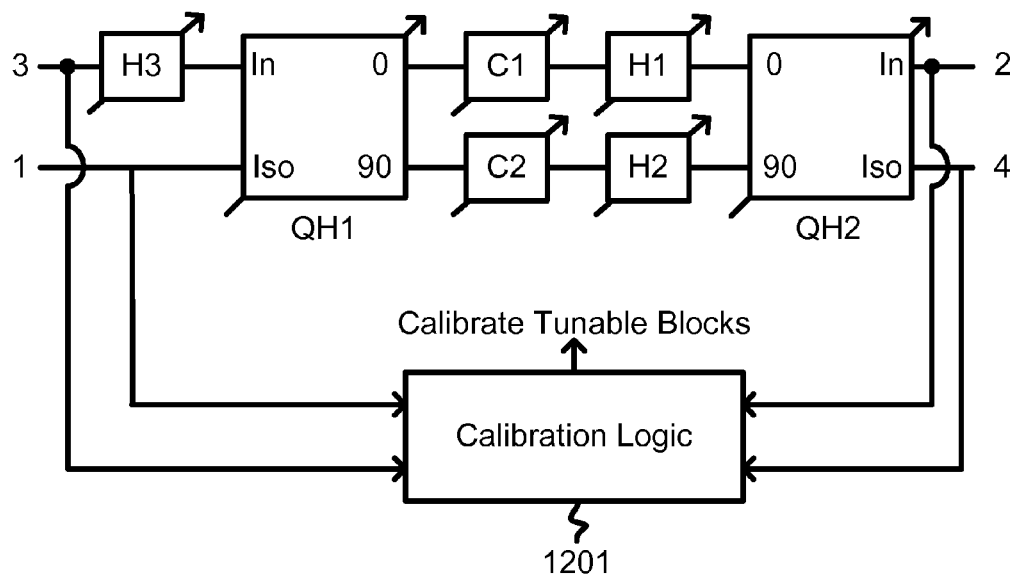
FIG. 12 illustrates embodiment of an enhanced hybrid-based cancellation scheme with correction circuitry and calibration logic that may be used to control tuning circuitries to achieve a desired performance.

FIG. 12 illustrates another embodiment of an enhanced hybrid-based cancellation scheme that uses variable components and calibration logic 1201 to assist in setting these variable components. The calibration logic 1201 may implement one or more calibration algorithms using samples of signals at one or more of ports 1, 2, 3, and 4. Blocks C1 and C2 may include tunable phase shifters, attenuators, and/or delay elements. The other components may be the same as the correspondingly-named components in any of the other figures. They may also be tunable. The calibration logic may be configured to output information indicative of needed settings for one or more of the tunable elements and/or may be configured to automatically tune these elements, which tuning may be updated during use of the system to compensate for changes that occur during such usage.

Figure 13:
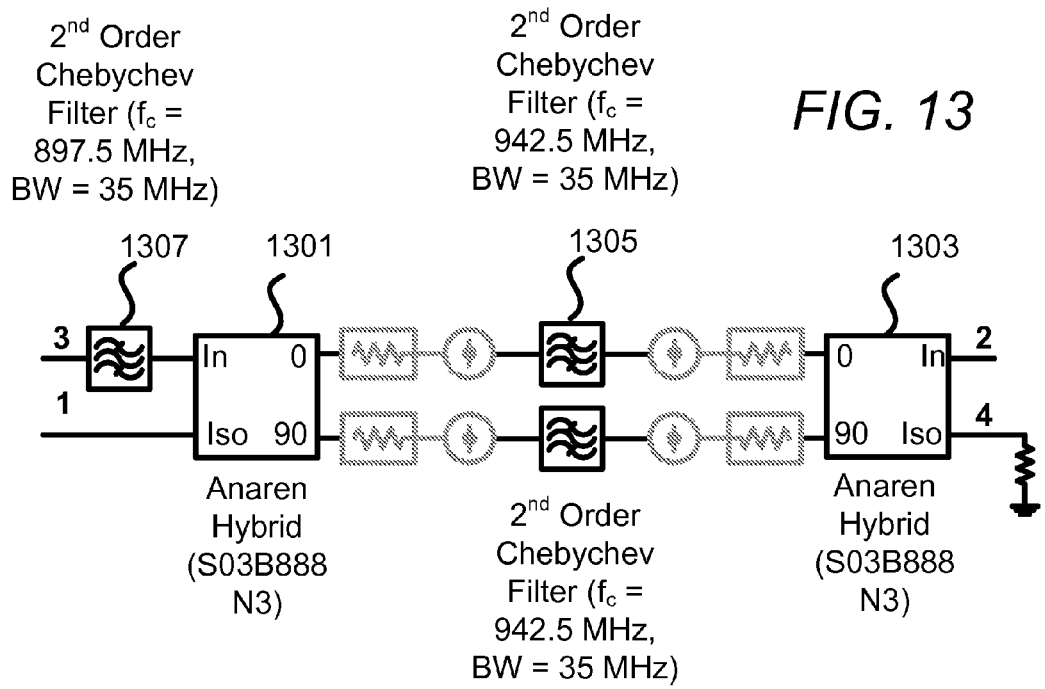
FIG. 13 illustrates an example of an LTE band 8 duplexer with correction circuitries added to a hybrid-based cancellation scheme.

FIG. 13 illustrates an example of an LTE band 8 duplexer with correction circuitries added to a hybrid-based cancellation scheme. Hybrids 1301 and 1303 may each be an off-the-shelf Anaren hybrid with about 24 dB isolation between their 0° and 90° ports. Filters 1305 and 1307 may be $2^{nd}$ order Chebychev filters.

Figure 14A:
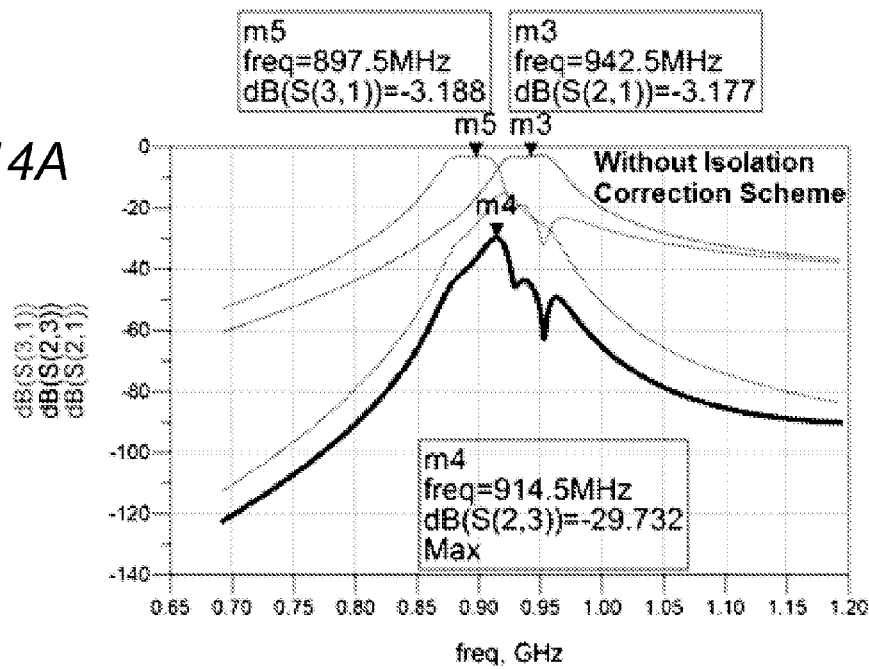
FIGS. 14A and 14B show S-parameter results of an example of a duplexer when no isolation enhancement is used and when the proposed isolation enhancement is used.
Figure 14B:
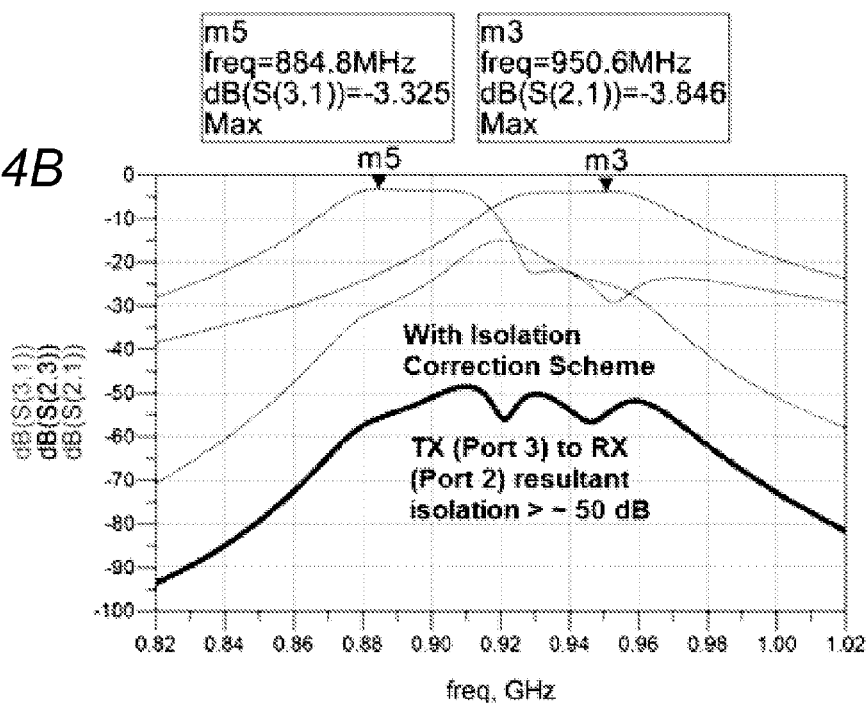

FIGS. 14A and 14B show S-parameter results of an example of a duplexer when no isolation enhancement is used and when the proposed isolation enhancement is used. As illustrated in these figures, the TX (port 3) to RX (port 2) isolation (bold black line) is enhanced by about 20 dB.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

An important advantage of cancellation schemes may be the enablement of compact realizations. For instance, any portion or entire parts of the hybrid-based cancellation scheme with the proposed enhancements may be realized in a compact form factor including, but not limited to, an integrated circuit. Specifically, hybrids, two-port networks, filters, amplifiers, attenuators, phase shifters, or delay blocks can be partially or completely realized monolithically in an integrated circuit. In one embodiment, the entire hybrid-based cancellation scheme with proposed enhancements may be integrated in a monolithic integrated circuit, such as a single silicon chip, or a single chip built using other semiconductor technologies. Integrated circuit realization may include other advantages such as the ability to realize compact transceiver or System-on-a-Chip (SOC) solutions. Integrated circuit realization may also include alternate realization of the building blocks while relying on the same underlying fundamental cancellation principles. For instance, any type of passive of active realization of the building blocks may be used. For instance, any number of functions may be realized in a single block. For instance, a single block may include filtering, attenuation, phase shifting, or delay functions.

Figure 15:
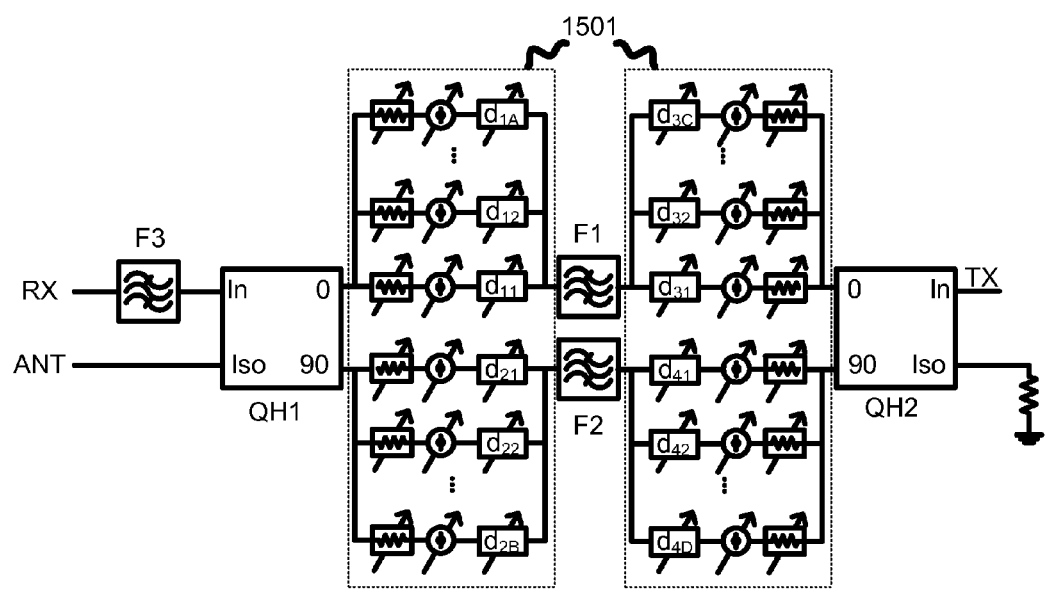
FIG. 15 illustrates an embodiment of an enhanced hybrid-based cancellation scheme with correction circuitry that includes several parallel paths of variable phase shifters, variable attenuators, and blocks that produce variable delay, and ports connected to an antenna, a receiver, and a transmitter.

FIG. 15 illustrates an embodiment of an enhanced hybrid-based cancellation scheme with multiple parallel paths of attenuators, phase shifters, and delays 1501 that may be used to enhance operation bandwidth. Filters with multiple pass-band and stop-bands may be used. Active filters may be realized in an integrated circuit.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A multi-port hybrid-based cancellation network comprising:
   a first quadrature hybrid;
   a second quadrature hybrid that is distinct from the first quadrature hybrid;
   a first two-port network connected between the first and the second quadrature hybrids;

a second two-port network that is distinct from but essentially the same as the first two-port network connected between the first and the second quadrature hybrids; and one or more other circuitry components connected between or connected to a connection between one of the quadrature hybrids and one of the two-port networks that have a configuration that:

reduce signal return loss in at least one of the ports of the multi-port hybrid-based cancellation network; or increase signal isolation between at least two of the ports of the multi-port hybrid-based cancellation network.

2. The multi-port hybrid-based cancellation network of claim 1 wherein the first and the second two-port networks each include a filter.

3. The multi-port hybrid-based cancellation network of claim 2 wherein the filter in the first and the second two-port networks are each tunable or switchable.

4. The multi-port hybrid-based cancellation network of claim 2 wherein the first and the second two-port networks each include multiple filters connected in parallel or series.

5. The multi-port hybrid-based cancellation network of claim 2 wherein each filter may be passive or active.

6. The multi-port hybrid-based cancellation network of claim 1 wherein the first and the second two-port networks each include an amplifier.

7. The multi-port hybrid-based cancellation network of claim 1 wherein the one or more other circuitry components include one or more attenuators.

8. The multi-port hybrid-based cancellation network of claim 1 wherein the one or more other circuitry components include one or more phase shifters.

9. The multi-port hybrid-based cancellation network of claim 1 wherein the one or more other circuitry components include one or more delay elements.

10. The multi-port hybrid-based cancellation network of claim 1 wherein the one or more other circuitry components include an impedance matching network.

11. The multi-port hybrid-based cancellation network of claim 1 wherein the one or more other circuitry components include at least two of the following types of circuits: attenuator, phase shifter, delay element, and impedance matching network.

12. The multi-port hybrid-based cancellation network of claim 1 wherein at least one of the quadrature hybrids, the two-port networks, or the other circuitry components include an adjustable component that can be adjusted to minimize the signal return loss or maximize the signal isolation.

13. The multi-port hybrid-based cancellation network of claim 1 wherein the multi-port hybrid-based cancellation network has a configuration that operates effectively within multiple frequency bands.

14. The multi-port hybrid-based cancellation network of claim 1 wherein:

one or more of the multi-ports functions as transmit ports;

another or more of the multi-ports functions as receive ports;

another or more of the multi-ports functions as antenna ports;

the first two-port network includes a first filter connected between the first and the second quadrature hybrids;

the second two-port network includes a second filter that is distinct from but essentially the same as the first filter connected between the first and the second quadrature hybrids; and the one or more other circuitry components:

reduce signal return loss in at least one of the ports of the multi-port hybrid-based cancellation network; or increase signal isolation between the transmit port and the receive port of the multi-port hybrid-based cancellation network; and the multi-port hybrid-based cancellation network further comprises a third filter that is distinct from the first and the second filters connected to the first quadrature hybrid.

15. The multi-port hybrid-based cancellation network of claim 14 wherein the one or more other circuitry components include one or more attenuators.

16. The multi-port hybrid-based cancellation network of claim 14 wherein the one or more other circuitry components include one or more phase shifters.

17. The multi-port hybrid-based cancellation network of claim 14 wherein the one or more other circuitry components include one or more delay elements.

18. The multi-port hybrid-based cancellation network of claim 14 wherein the one or more other circuitry components include an impedance matching network.

19. The multi-port hybrid-based cancellation network of claim 14 wherein at least one of the quadrature hybrids, the filters, or the other circuitry components include an adjustable component that can be adjusted to reduce the signal return loss or increase the signal isolation.

20. The multi-port hybrid-based cancellation network of claim 19 further comprising calibration logic that detects signals at one or more of the ports and develops information or one or more signals based on the detected signals that is relevant to adjusting the adjustable component to minimize the signal return loss or maximize the signal isolation.

21. The multi-port hybrid-based cancellation network of claim 14 wherein the first, second, or third filter is tunable or switchable.

22. The multi-port hybrid-based cancellation network of claim 14 wherein the multi-port hybrid-based cancellation network operates effectively within multiple frequency bands.

23. The multi-port hybrid-based cancellation network of claim 1 wherein all of the components of the multi-port hybrid-based cancellation network are contained in a single integrated circuit.

* * * * *

UNITED STATES PATENT AND TRADEMARK OFFICE
CERTIFICATE OF CORRECTION

PATENT NO. : 9,590,794 B2  
APPLICATION NO. : 14/565752  
DATED : March 7, 2017  
INVENTOR(S) : Behnam Analui et al.

Page 1 of 1

It is certified that error appears in the above-identified patent and that said Letters Patent is hereby corrected as shown below:

In the Specification

Column 1, Line 5, insert the following statement of government support:
--This invention was made with government support under grant no. HR0011-12-C-0094 awarded by the Defense Advanced Research Projects Agency (DARPA) and under grant no. N00014-12-C-0130 awarded by the Office of Naval Research (ONR). The government has certain rights in the invention.--

Signed and Sealed this
Twenty-second Day of September, 2020

Andrei Iancu
*Director of the United States Patent and Trademark Office*